United States Patent [19]
Groenewegen

[11] Patent Number: 5,123,538
[45] Date of Patent: Jun. 23, 1992

[54] CRASH PROTECTION ENCLOSURE FOR SOLID STATE MEMORY DEVICES

[75] Inventor: Johannes B. Groenewegen, Kirkland, Wash.

[73] Assignee: Sundstrand Corporation, Rockford, Ill.

[21] Appl. No.: 691,934

[22] Filed: Apr. 26, 1991

[51] Int. Cl.$^5$ ............................. B65D 85/38
[52] U.S. Cl. ................. 206/521; 174/52.2; 220/453; 220/468
[58] Field of Search ............. 174/52.2; 206/305, 328, 206/334, 521, 811; 220/415, 453, 468; 244/1 R; 455/96, 98

[56] References Cited

U.S. PATENT DOCUMENTS

| | | | |
|---|---|---|---|
| 2,809,332 | 10/1957 | Sherwood | 174/52.2 |
| 3,383,565 | 5/1968 | Gritton | 174/52.2 |
| 3,439,231 | 4/1969 | Booe | 174/52.2 |
| 3,882,394 | 5/1975 | Koster et al. | 455/98 |
| 3,906,370 | 9/1975 | Apps | 455/96 |
| 4,480,148 | 10/1984 | Archer | 174/52.2 |
| 4,694,119 | 9/1987 | Groenewegen | |
| 4,707,763 | 11/1987 | Kudo | 174/52.2 |
| 4,769,344 | 9/1988 | Sakai et al. | 174/52.2 |
| 4,944,401 | 7/1990 | Groenewegen | |

*Primary Examiner*—Jimmy G. Foster
*Attorney, Agent, or Firm*—Mason, Kolehmainen, Rathburn & Wyss

[57] ABSTRACT

A crash survivable protective enclosure for flight data recorders, cockpit voice recorders and memory devices employing a solid state memory element includes a conformal coating of air excluding plastic material around the memory element. An inner shell of metal having a low position on the periodic table in comparison to tin and copper associated with the memory element is provided to enclose the memory element and the conformal coating. Heat insulating fillers are provided around the inner metal shell which serves as a sacrificial anode when the enclosure is exposed to salt water. An outer metal shell formed of high strength material is provided around the insulating filler for resisting physical forces applied from an exterior of the protective enclosure during a crash.

23 Claims, 1 Drawing Sheet

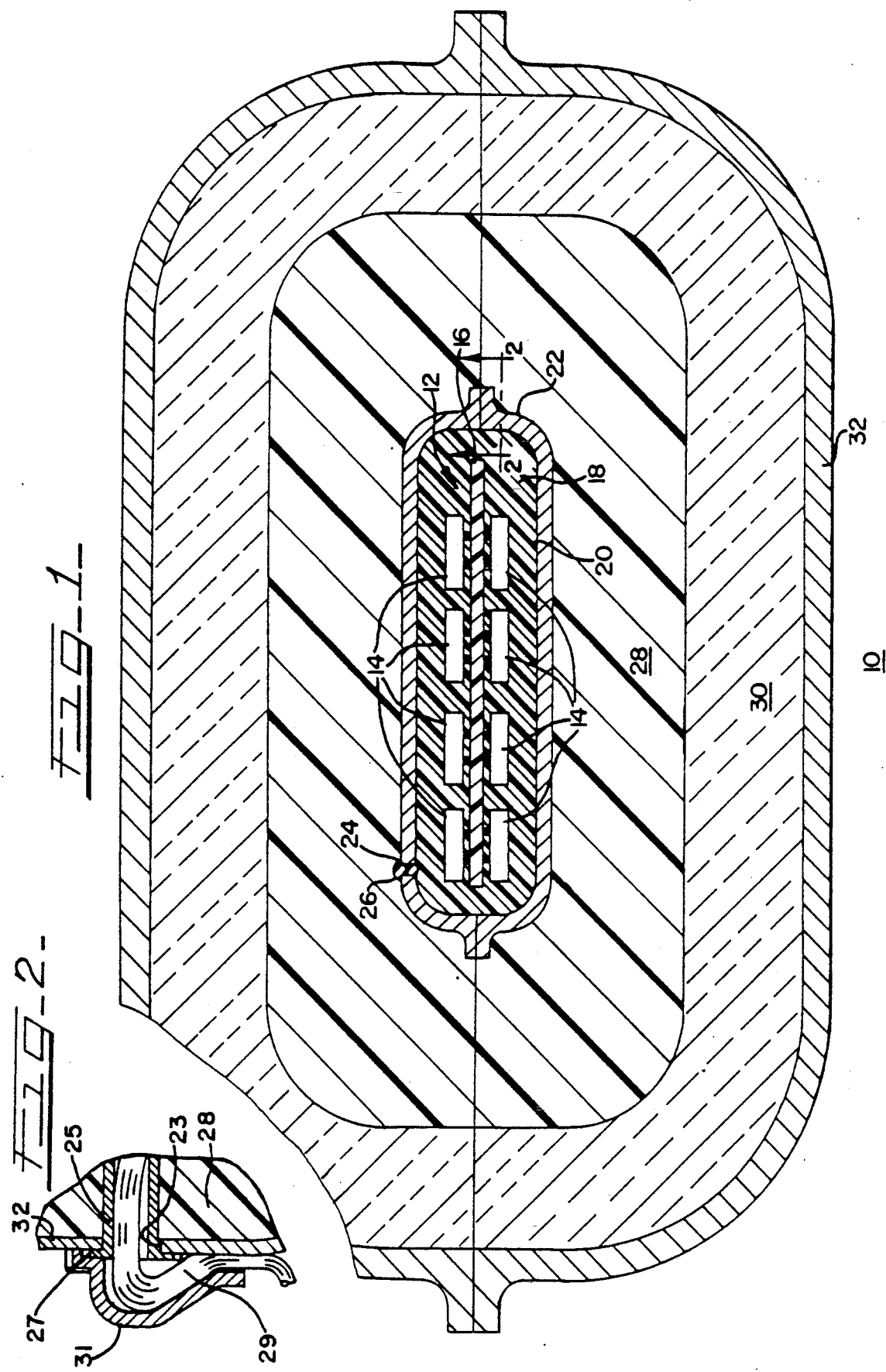

CRASH PROTECTION ENCLOSURE FOR SOLID STATE MEMORY DEVICES

BACKGROUND OF THE INVENTION

1. Field of the Invention

The present invention relates to crash survivable protective enclosures used for flight recorders, cockpit voice recorders and solid state memory devices used in aircraft and other vehicles operating over both land and water. The invention is directed towards a crash survivable protective enclosure which is capable of withstanding high impact forces, shock and mechanical penetration forces that commonly occur in a crash and in addition is capable of withstanding the high temperatures, flames and heat that often develop after a crash. Moreover, the new and improved protective enclosure is especially designed for resisting damage to solid state memory devices even when the protective enclosure is subjected to immersion in salt water for prolonged periods of up to thirty days and for depths of up to 20,000 feet.

In particular, the crash protective enclosure in accordance with the present invention, is adapted to meet or better all of the requirements as set forth in EUROCAE Document No. ED-55, which document sets forth the current requirements for flight recorders utilizing solid state memory devices.

One of these requirements is that the recorded information be retrievable after the protective enclosure has been exposed to sea water at an immersion depth of 20,000 feet for a duration of thirty days. The protective enclosure of the present invention is specifically designed/adapted to conform and meet this requirement in a new and unique way.

2. Background of the Prior Art

Solid state memory devices used for crash protected flight recorders such as EEPROM's or flash memory units are typically packaged in either a ceramic or a plastic protective enclosure. A ceramic package protects the memory devices utilizing a small, hermetically sealed air cavity in which the memory devices are contained. The plastic packages are constructed utilizing a molding process carried out under high molding pressures wherein the device and lead wires extending to the memory device are totally embedded in a plastic compound so that few, if any, air spaces, bubbles or air voids exist within the plastic package immediately surrounding the memory device.

U.S. Pat. No. 4,944,401 describes a crash survivable enclosure capable of surviving relatively high value hydraulic pressures (8,660 psi) that would exist at an immersion depth of 20,000 feet. The crash, fire and water immersion protection is provided by the physical design of the enclosure with emphasis on the high pressure forces encountered during deep and prolonged salt water immersion. Tests have been performed on ceramic enclosed memory devices directly exposed to 20,000 foot depth equivalent pressures in salt water immersion and these tests have shown conclusively that ceramic packages cannot usually support and protect against damage to the recorded information under high hydraulic pressures of this magnitude. In these tests, the ceramic walls generally collapse under such pressures and the memory devices contained within are substantially destroyed. Tests on plastic resin packaged memory devices, however, including both dual in-line as well as PLCC types have been successfully conducted simulating exposure to 20,000 foot equivalent depths of salt water for periods of thirty days. The tests have demonstrated a capability of the plastic enclosed memory devices to survive well in this harsh environment and still yield the vital flight memory data previously recorded.

The use of at least one pressure resisting vessel in a protective enclosure as set forth in U.S. Pat. No. 4,944,401 is thought to be generally desirable for survival of the internal memory devices and the flight data therein when either a ceramic or a plastic enclosed memory device is utilized.

OBJECTS OF THE INVENTION

It is an object of the present invention to provide a new and improved relatively low cost, crash survivable protective enclosure for flight data recorders, cockpit voice recorders, memory devices, and the like, employing a solid state memory element.

More particularly, it is desirable to provide a new and improved crash surviving protective enclosure especially well adapted to survive immersion in salt water at relatively shallow depths where oxygen is plentiful as well as immersion at intermediate depths whereat corrosion may or may not take place at all and at depths of up to 20,000 feet in salt water wherein extremely high hydraulic pressures are exerted.

Another object of the present invention is to provide a new and improved crash surviving protective enclosure of the character described which is adapted to meet or exceed all of the requirements therefor as spelled out in EUROCAE Document No. ED-55.

Still another object of the present invention is to provide a new and improved crash survivable protective enclosure which employs a sacrificial anode to protect the solid state memory elements against corrosion in relative shallow depth salt water immersion where abundant dissolved oxygen is present.

Yet another object of the present invention is to provide a new and improved crash survivable protective enclosure which is simple in construction, relatively light in weight and which is highly reliable in operation to ensure that recorded flight data, voice information and/or other types of recorded information will be fully retrievable even though the protective enclosure and contents is subjected to one or more of the conditions described in EUROCAE Document No. ED-55.

BRIEF SUMMARY OF THE PRESENT INVENTION

The foregoing and other objects and advantages of the present invention are accomplished in a new and improved crash survivable protective enclosure for flight data recorders, cockpit voice recorders and other memory devices employing one or more solid state memory elements including a conformal coating of plastic material closely surrounding the memory element for excluding substantially all of the air from around the generally irregular shaped surface of the memory elements. The protective enclosure includes an inner metallic shell made of a metal which is low on the chemical periodic table in comparison to tin and/or copper usually present in memory elements and/or leads connected thereto. The anodic metal shell functions to physically protect its contents and also act as a sacrificial anode when exposed to salt water so that corrosion of the memory elements or leads does not take place.

A first heat insulating filler is formed around the inner metal shell and this filler comprises a wax-type or synthetic wax-like material having a high latent heat of fusion for acting as a heat sink in order to absorb high quantities of heat during a phase transition of the material at an elevated temperature. A second filler of high quality, high efficiency thermal insulation is formed around the wax-like first filler to minimize conductive heat transfer into the incremental shell and contents. An outer metal shell formed of high strength, lightweight metal is provided around the fillers for resisting physical impact forces applied from the exterior of the protective enclosure as might be encountered in a crash followed by a fire and subsequent immersion in salt water.

BRIEF DESCRIPTION OF THE DRAWINGS

For a better understanding of the present invention, reference should be had to the following detailed description taken in conjunction with the drawing, in which:

FIG. 1 is a transverse cross-sectional view of a new and improved relatively low cost, crash survivable protective enclosure for flight data recorders, cockpit voice recorders and memory devices employing one or more solid state memory elements in accordance with the present invention; and FIG. 2 is a fragmentary cross-sectional view taken substantially along lines 2—2 of FIG. 1.

DETAILED DESCRIPTION OF A PREFERRED EMBODIMENT OF THE INVENTION

Referring now more particularly to the drawing, therein is illustrated a new and improved crash survivable protective enclosure for flight data recorders, cockpit voice recorders and other types of solid state memory devices employing a solid state memory element. The crash survivable protective enclosure is referred to generally by the reference numeral 10 and is constructed to meet or exceed the requirements of EUROCAE Document No. ED-55. The enclosure 10 protects and encloses a solid state memory device 12 which generally includes one or more solid state memory elements 14 mounted on a printed circuit board 16 as illustrated. Printed circuit boards 16 generally employ copper in the circuitry and include soldering having tin and tin alloys. Copper electrical leads (not shown) in connection with the solid state memory elements 14 similarly employ copper, tin and tin alloys in the make-up thereof.

As set forth in U.S. Pat. No. 4,944,401, electrical wires and leads, usually in the form of a ribbon-like cable or multi-strand conductor or the like pass through a high pressure, bulkhead-type, cylindrical feed-through unit (not shown) of the type obtainable from Douglas Engineering Company of Rockaway, N.J. These sealed, feed-through units are relatively expensive because they are engineered and designed to be capable of withstanding salt water at a pressure of 8,660 psi without permitting leakage around the electrical cables or lead lines passing into the interior of the crash survivable protective enclosure. The crash protective enclosure 10 of the present invention does not require the use of an expensive feed-through of the type described in the aforementioned patent and accordingly, the protective enclosure 10 can be manufactured at a much lower cost because the protective metal shells thereof do not have to be sealed, pressure vessels capable of sealing out salt water under pressures of a magnitude in the range of 8,660 psi.

In accordance with the present invention, the solid state memory device 12 is encapsulated within a conformal coating 18 formed of plastic resin material such as a polyurethane conformal coating, an acrylic conformal coating or an RTV (room temperature vulcanizing) silicone rubber conformal coating, all of which coatings when applied effectively eliminate and/or minimize the presence of bubbles or entrapped air volumes around the normally irregular outer surface of a solid state memory device 12. The conformal coating material is applied in several applications forming a laminate of several successive protective layers formed around the entire outer surface of the solid state memory device 12. The conformal coating can be applied by spraying, dipping, washing and/or brushing in a manner so as to minimize the inclusion of any voids or air bubbles in the immediate vicinity of the outer surface of the solid state memory device 12. The conformally coated solid state memory device 12 is then trimmed or shaped as necessary to form a smooth circular or rectangular body 20.

The coated body 20 is enclosed within an inner metallic shell 22 formed of a metal such as aluminum, zinc, zinc and aluminum alloys and/or zinc plated sheet steel, which aluminum and zinc elements are lower on the chemical periodic table of elements in comparison to tin or copper that is usually present on the printed circuit board 16, the solid state memory elements 14, soldered connections and the circuit leads, cables, etc. connected therewith. The inner shell 22 is formed in halves assembled together around the conformal coating material 18 in a manner to exclude air from the interior of the shell 22 as set forth in the aforementioned U.S. Patent. The inner shell 22 is formed with a small opening 24 in a wall thereof and this opening is closed from the outside with a plug 26 formed of rubber or rubber-like material such as an RTV silicone rubber or a similar silicone-based compound.

The protective enclosure 10 has an outer shell 32 which includes an opening 23 (FIG. 2) for a tubular fitting 25 having a flange or collar 27 at the outer end bearing against the outer surface of the shell. An electrical lead 29, preferably in the form of a ribbon-like cable or multi-strand conductor, is connected to the solid state memory 12 contained within the shell 22 and passes out of the opening 23 through the tubular fitting 27. An outer protective cap 31 is secured to the outer surface of the shell 22 for protection of the electrical lead 29 which continues to the exterior of the protective enclosure 10 for connection with aircraft systems, etc. The flanged fitting 25 and the cap 31 are relatively low in cost and do not have to positively seal against the entry of salt water from the exterior of the shell 22.

When the enclosure 10 is immersed in salt water at a relatively shallow depth, the pressure differential between the interior and the exterior of the inner shell 22 is generally not sufficient to displace the rubber plug 26 which remains intact and continues to seal off the vent opening 24. However, should the protective enclosure 10 be subjected to much greater pressures as found in deeper parts of the ocean, the pressure differential may become sufficient to eject the plug 26 inwardly into the interior of the inner metal shell 22. When this occurs salt water may enter the interior of the shell 22, and begin to act as an electrolyte between the copper and tin of the solid state memory device 12 on the one hand and the zinc or aluminum on the inside wall surface of the shell 22. This inside surface of the inner shell 22 then acts as or becomes a sacrificial anodic surface with respect to the tin and copper of the printed circuits on the circuit board 16, solder leads, etc. which act as a cathode. If corrosion occurs at all, it takes place at the anodic inside surface of the inner shell 22 rather than at cathodic surface portions of copper and tin plated memory elements 14 and leads associated with the circuit board 16 and the solid state memory device 12. Substantially no chemical corrosion ever takes place at the memory elements 14 but any corrosion that does take place within the shell 22 occurs at the inside surface of the shell 22 because the surface is formed of aluminum, zinc and/or other alloys that are lower on the chemical periodic table than the tin and/or copper traces present in the solid state memory device 12 and associated contacts and leads.

As the protective enclosure 10 descends downwardly to greater depths in an ocean down to as low as 20,000 feet, the amount of oxygen present in the salt water diminishes greatly until at these lower depths of 15,000–20,000 feet, substantially no free oxygen exists and there is very little corrosive activity even though the salt water hydraulic forces may eject the plug 26 inwardly into the inner shell 22 and directly enter the shell forming an electrolyte solution in contact between the inside surface of the shell and the tin and copper traces of the solid state memory device 12, leads, encapsulated circuit board 16 and individual solid state memory elements 14, etc.

In accordance with the present invention, the inner shell 22 is outwardly surrounded and encased with a first layer or mass of thermal heat insulating material 28. This material performs a heat shielding function by exhibiting a phase transition at an elevated temperature and comprises at least a portion of the overall heat shielding structure of the protective enclosure 10 that encases and surrounds the memory elements 14 that are to be protected against heat, fire and high temperatures. The temperature at which phase transition occurs in the material 28 is selected to be above the peak operating temperatures that would normally be encountered but at or below a peak or limiting design temperature objective for the memory devices 12. This will help to ensure that the devices 12 remain intact with the stored information in retrievable condition.

When the protective enclosure 10 is subjected to a fire or other high temperature environment, the phase change material 28 as well as an outer enclosing and surrounding mass or wall of high efficiency, low conductivity, thermal insulation material 30 functions as a conventional heat shield by exhibiting a relatively high value thermal inertia to inward heat transfer toward the solid state memory elements 14. As the phase transition material 28 approaches a transition point in temperature, it begins to change in phase and serve as a heat sink because the additional heat energy reaching the material 28 is then utilized to convert the material itself from a solid state to a liquid state or to convert the material 28 from one solid state condition to another solid state condition with no appreciable temperature rise occurring. During the conversion phase, the maximum temperature of the material 28 remains essentially constant even though a much higher temperature environment may exist outside of the enclosure 10.

It is desirable to maintain the solid state electronic memory device 12 at a temperature level at or below a maximum of 200° C. when the protective enclosure 10 is exposed to a heat source such as a fire that produces temperatures of 1000° C. for a period of one-half hour and when the internal solid state memory device 12 is left undisturbed for an additional four hours thereafter.

It has been found that a preferred phase transition type, heat sink forming insulating material 28 may comprise a synthetic organic amide wax. One such amide wax that has successfully been used is a proprietary formulation distributed under the trade name HM23 by Glyco, Inc. of Greenwich, Conn. Other suitable synthetic materials include a wax chemically defined as N,N'ethylenebisstearamide or known by its synonym N,N'distearoylethylenediamine which has an empirical chemical configuration of $H_{35}C_{17}COHNC_2H_4NHCOC_{17}H_{35}$ wherein the alkyd radicals extend linearly from the amide linkages on either side of the molecule. In addition, an organic solid solution of pentaerythritol $C_5H_{12}O_4$ can also be employed for the heat sink phase transition material 28 immediately surrounding the inner anodic metal shell 22.

Other proprietary synthetic amide waxes manufactured by a division of the LONZA Chemical Co. can be used for the phase change transition material 28. ACCOWAX HM23 having a melting point of 193° C. and ACRAWAX HMS having a melting point of 232° C. are suitable materials manufactured by the LONZA division.

The material forming the outer heat shielding insulation structure 30 can be chosen from high efficiency thermal insulators of a proprietary nature including combinations of fibrous materials and fine particulate matter known as "MIN-K 2000" and "MICROTHERM" as manufactured and sold by The Manville Company of Denver, Colo. and by the Micropore Insulation, Ltd. of Upton-Wirral, Merseyside, England, respectively. These materials exhibit a very low thermal conductivity, for example, $K=0.146$ at 170° C. and $K=0.27$ at 1100° C. Currently, a material marketed under the trademark "MICROTHERM" is preferred for the thermal insulating material 30. Reference should also be had to U.S. Pat. No. 4,694,119 incorporated hereby by reference for further details on the characteristics of the respective insulating materials 28 and 30 which form the thermal insulating heat shield structure around the inner anodic metal shell 22 which is formed of zinc, aluminum, zinc plated steel and/or alloys of zinc or aluminum.

In order to withstand exterior physical impact forces, and thereby prevent physical destruction or crushing of the internal memory device 12, the protective enclosure 10 includes an outer shell 32 formed of a suitable thickness of high strength, light-in-weight, corrosion resistant metal capable of withstanding penetration test requirements delineated in EUROCAE specification ED-55. Moreover, the shell 32 is further able to withstand physical impact shock forces ranging from 3400 G's lasting for 6.5 milliseconds to 1000 G's lasting for 15 milliseconds acting on the orthogonal axes of the respective inner and outer shells 22 and 32. A fitting 25 and cap 31 are provided for an opening in the outer shell 32 to pass the cable 29 to the exterior of the protective enclosure 10.

Normally, the shells 22 and 32 may range in thicknesses from ⅛" to ¼" and are generally rectangular in shape. The outer shell 32 is especially designed to provide protection for its contents against physical impact shock forces equivalent to the penetration force developed by a 500 pound steel bar dropped from a height of ten feet to strike the wall of the outer shell 32 at a point of contact having an area no larger than 0.05 square inches. Suitable lightweight, extremely strong metals for the outer shell 32 that have successfully withstood the parameters set forth in EUROCAE Document No. ED-55 are titanium alloys 15-3-3-3 and 10-2-3, and 17-7 type stainless steels.

The economical, cost efficient protective enclosure 10 thus provides excellent protection for solid state memory devices 12 against heat, fire, high temperatures, corrosive salt water immersion (shallow and deep), and high impact forces. Because a sealed pressure vessel and expensive sealed cable feed-through unit are not necessary, the crash protective enclosure 10 is much lower in cost to manufacture than other types of devices capable of meeting the requirements of EUROCAE Document No. ED-55.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A crash survivable protective enclosure for flight data recorders, cockpit voice recorders and memory devices employing a solid state memory element, comprising:
   conformal coating means of air excluding plastic material surrounding said memory element;
   inner shell means made of metal capable of acting as a sacrificial anode with respect to any tin and copper associated with said memory element when said enclosure is exposed to salt water;
   first filler means around said inner shell comprising a wax-type material having a high latent heat of fusion to act as a heat sink for absorbing a high quantity of heat during a phase transition at an elevated temperature;
   second filler means around said inner shell comprising a thermal insulation; and
   outer shell means formed of high strength metal for resisting physical forces applied externally to said protective enclosure.

2. The protective enclosure of claim 1, wherein:
   said inner shell means is formed with a vent opening and includes plug means normally closing said vent opening until said enclosure is subjected to relatively high external pressure.

3. The protective enclosure of claim 1, wherein:
   said second filler means comprises a stable solid material capable of withstanding high temperatures.

4. The protective enclosure of claim 3, wherein:
   said second filler means comprises a high efficiency thermal insulating material.

5. The protective enclosure of claim 4, wherein:
   said second filler means surrounds said first filler means.

6. The protective enclosure of claim 1, wherein:
   said inner shell means is formed of aluminum, aluminum alloy, zinc, zinc alloys or zinc plated sheet steel.

7. The protective enclosure of claim 1, wherein:
   said conformal coating means is formed of acrylic resin, polyurethane resin, silicone rubber (RTV) or other silicone based compounds.

8. The protective enclosure of claim 1, wherein:
   said first filler means comprises amide-type synthetic organic wax.

9. The protective enclosure of claim 1, wherein:
   said first filler means comprises pentaerythritol.

10. The protective enclosure of claim 1, wherein:
    said outer shell means comprises titanium alloys or stainless steel alloys.

11. A protective enclosure for electronic memory devices, comprising:
    conformal coating means of plastic resin surrounding a memory device for excluding air from the vicinity thereof;
    protective metal shell means enclosing said memory device and surrounding said coating means around an outer surface of said coating means, said shell means formed of metal capable of serving as a sacrificial anode with respect to any tin and copper associated with said memory element when said enclosure is subject to contact with a liquid electrolyte.

12. The enclosure of claim 11, wherein:
    said metal shell means comprises a hollow vessel enclosing said memory device and coating means thereon with substantially all of the air removed from the interior of said vessel.

13. The enclosure of claim 11, wherein:
    said metal shell means includes an inner surface for serving as a sacrificial anode when salt water penetrates the interior of said shell means upon immersion of said enclosure to a substantial depth in salt water.

14. The enclosure of claim 11, including:
    heat insulating means around said metal shell means for limiting the temperature thereof when said enclosure is exposed to heat and high temperatures.

15. The enclosure of claim 14, wherein:
    said heat insulation means includes an enclosing medium around said metal shell means having a high heat of fusion for acting as a heat sink.

16. The enclosure of claim 15, wherein:
    said heat insulation means also includes a medium having a low heat conductivity to minimize heat transfer between said memory device and the exterior of said enclosure.

17. The enclosure of claim 16, including:
    outer shell means around said heat insulation means for protecting said memory device against forces applied from the exterior.

18. The enclosure of claim 17, wherein:
    a space is formed between said metal shell means and said outer shell means and said space is substantially filled with said heat insulation means.

19. The protective enclosure of claim 11, wherein:
    said shell means includes a surface of aluminum.

20. The protective enclosure of claim 11, wherein:
    said shell means includes a surface of zinc.

21. The protective enclosure of claim 11, wherein:
    said shell means includes a surface of zinc and aluminum alloys.

22. The protective enclosure of claim 11, wherein:
    said shell means comprises zinc plated sheet steel.

23. A protective enclosure for electronic memory devices, comprising:

conformal coating means of plastic resin surrounding a memory device for excluding air from the vicinity thereof;

protective metal shell means enclosing said memory device and surrounding said coating means around an outer surface of said coating means, said shell means formed of metal capable of serving as a sacrificial anode with respect to any tin and copper associated with said memory element when said enclosure is subject to contact with a liquid electrolyte;

said metal shell means is formed with a vent opening, and including plug means of elastomeric material normally closing said vent opening against the ingress of substances entering exterior of said shell means.

* * * * *